(12) United States Patent
Liang et al.

(10) Patent No.: US 11,422,473 B2
(45) Date of Patent: Aug. 23, 2022

(54) UTILIZE PATTERN RECOGNITION TO IMPROVE SEM CONTOUR MEASUREMENT ACCURACY AND STABILITY AUTOMATICALLY

(71) Applicant: ASML NETHERLANDS B.V., Veldhoven (NL)

(72) Inventors: Jiao Liang, San Jose, CA (US); Chen Zhang, San Jose, CA (US); Qiang Zhang, Campbell, CA (US); Yunbo Guo, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/256,332

(22) PCT Filed: Jun. 21, 2019

(86) PCT No.: PCT/EP2019/066520
§ 371 (c)(1),
(2) Date: Dec. 28, 2020

(87) PCT Pub. No.: WO2020/011513
PCT Pub. Date: Jan. 16, 2020

(65) Prior Publication Data
US 2021/0263426 A1 Aug. 26, 2021

Related U.S. Application Data

(60) Provisional application No. 62/697,169, filed on Jul. 12, 2018.

(51) Int. Cl.
*G03F 7/20* (2006.01)

(52) U.S. Cl.
CPC ...... *G03F 7/70508* (2013.01); *G03F 7/70283* (2013.01); *G03F 7/70525* (2013.01); *G03F 7/70625* (2013.01); *G03F 7/70683* (2013.01)

(58) Field of Classification Search
CPC ............ G03F 7/70508; G03F 7/70283; G03F 7/70525; G03F 7/70625; G03F 7/70683;
(Continued)

(56) References Cited

U.S. PATENT DOCUMENTS

| 5,229,872 A | 7/1993 | Mumola |
| 6,046,792 A | 4/2000 | Van Der Werf et al. |

(Continued)

FOREIGN PATENT DOCUMENTS

| TW | 201721280 | 6/2016 |
| TW | 201800871 | 1/2018 |
| WO | 2017060192 | 4/2017 |

OTHER PUBLICATIONS

International Search Report and Written Opinion issued in corresponding PCT Patent Application No. PCT/EP2019/066520, dated Nov. 12, 2019.

(Continued)

*Primary Examiner* — Mesfin T Asfaw
(74) *Attorney, Agent, or Firm* — Pillsbury Winthrop Shaw Pittman LLP

(57) ABSTRACT

A method for improving a process model by measuring a feature on a printed design that was constructed based in part on a target design is disclosed. The method includes obtaining a) an image of the printed design from an image capture device and b) contours based on shapes in the image. The method also includes identifying, by a pattern recognition program, patterns on the target design that include the feature and determining coordinates, on the contours, that correspond to the feature. The method further includes improving the process model by at least a) providing a measurement of the feature based on the coordinates and b)

(Continued)

calibrating the process model based on a comparison of the measurement with a corresponding feature in the target design.

20 Claims, 13 Drawing Sheets

(58) Field of Classification Search
CPC . G03F 7/70441; G03F 7/70616; G06T 7/001; G06T 5/50; G06T 7/13; G06K 9/4604
See application file for complete search history.

(56) References Cited

U.S. PATENT DOCUMENTS

| | | |
|---|---|---|
| 7,587,704 B2 | 9/2009 | Ye et al. |
| 2007/0031745 A1 | 2/2007 | Ye et al. |
| 2007/0050749 A1 | 3/2007 | Ye et al. |
| 2008/0301620 A1 | 12/2008 | Ye et al. |
| 2008/0309897 A1 | 12/2008 | Wong et al. |
| 2009/0157630 A1 | 6/2009 | Yuan |
| 2010/0162197 A1 | 6/2010 | Ye et al. |
| 2010/0180251 A1 | 7/2010 | Ye et al. |
| 2012/0110522 A1 | 5/2012 | Bailey et al. |
| 2015/0146966 A1* | 5/2015 | Weisbuch ............ G06K 9/4604 382/145 |
| 2017/0082927 A1 | 3/2017 | Hsu et al. |
| 2018/0275521 A1 | 9/2018 | Wallow et al. |
| 2019/0137889 A1 | 5/2019 | Tel et al. |

OTHER PUBLICATIONS

Vasek, J. et al.: "SEM-contour-based OPC model calibration through the process window", Proc. of SPIE, vol. 6518, Mar. 15, 2007.

Lorusso, G.F., et al.: "Advanced DFM applications using Design Based Metrology on CD SEM", Proc. of SPIE, vol. 6152, Mar. 10, 2006.

* cited by examiner

UTILIZE PATTERN RECOGNITION TO IMPROVE SEM CONTOUR MEASUREMENT ACCURACY AND STABILITY AUTOMATICALLY

CROSS-REFERENCE TO RELATED APPLICATIONS

This application is the U.S. national phase entry of PCT Patent Application No. PCT/EP2019/066520, which was filed Jun. 21, 2018, which claims the benefit of priority of U.S. Patent Application No. 62/697,169, which was filed on Jul. 12, 2018, and which is incorporated herein in its entirety by reference.

TECHNICAL FIELD

The description herein relates generally to mask manufacturing and patterning processes. More particularly, the disclosure includes apparatus, methods, and computer programs for incorporating pattern recognition into contour determination.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is can be referred to as low-k1 lithography, according to the resolution formula $CD=k1\times\lambda/NA$, where $\lambda$ is the wavelength of radiation employed (e.g., 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a method for improving a process model by measuring a feature on a printed design that was constructed based in part on a target design. The method includes obtaining a) an image of the printed design from an image capture device and b) contours based on shapes in the image. The method also includes identifying, by a pattern recognition program, patterns on the target design that include the feature and determining coordinates, on the contours, that correspond to the feature. The method further includes improving the process model by at least a) providing a measurement of the feature based on the coordinates and b) calibrating the process model based on a comparison of the measurement with a corresponding feature in the target design.

In an embodiment, the feature can be at least one of an edge placement gauge or a critical dimension. The coordinates can be coordinates of edge placement gauges or critical dimensions. The measurement can be generated by averaging the coordinates. The feature can include at least one of a curvature, a depth, an angle, a band width, and a slope on the printed design. The feature can also include at least one of a contrast and an intensity of the image.

In an embodiment, the method can include generating the contours from the image and aligning the image with the target design based at least on a comparison between the target design and the contours.

In another embodiment, the method can include generating horizontal or vertical cutline across one or more parallel lines in the target design and determining a critical dimension based at least an intersection of the horizontal or vertical cutline with the contours.

In yet another embodiment, the method can include generating an angled cutline extending from a point in the target design and generating an EP gauge based at least on an intersection of the angled cutline with the contours.

In an embodiment, the method can include receiving user input specifying a density of cutlines along a portion of the patterns, the density corresponding to a number of cutlines per unit length along the portion.

In some embodiments, the method can include locating, from the target design, other patterns that are the same as the pattern and determining the coordinates from the other patterns. Also, the locating can be further based on a comparison of coordinates of polygons from the target design. The method can include receiving, at the pattern recognition program, a first pattern and a second pattern, determining whether the first pattern and the second pattern are the same based on a plurality of the coordinates in the first and second pattern, and determining the measurement at least based on the first pattern and the second pattern.

In an embodiment, the method can further include accounting for one or more of a translation or a rotation of the first pattern relative to the second pattern when determining whether the first pattern and the second pattern are the same. In other embodiments, the pattern recognition program can identify other patterns based on an exact match having zero variation or the pattern recognition program can identify other patterns based on a fuzzy match. The fuzzy match can allow up to 2 nm of variation between the coordinates in the other patterns.

In an interrelated aspect, a method for calibrating an optical proximity correction model by measuring a feature on a printed design that was constructed based in part on a target design, can include obtaining a) an image of the printed design from a scanning electron microscope and b) contours based on shapes in the image. The method can also include identifying, by a pattern recognition program, patterns on the target design that include the feature. The method can further include determining coordinates, on the contours, that correspond to the feature and improving the optical proximity correction model by at least a) providing a measurement of the feature based on the coordinates and b) calibrating the process model based on a comparison of the measurement with a corresponding feature in the target design.

In other interrelated aspects, there is provided a computer program product comprising a non-transitory computer readable medium having instructions recorded thereon, the instructions when executed by a computer implementing the methods herein.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

Figure 1:
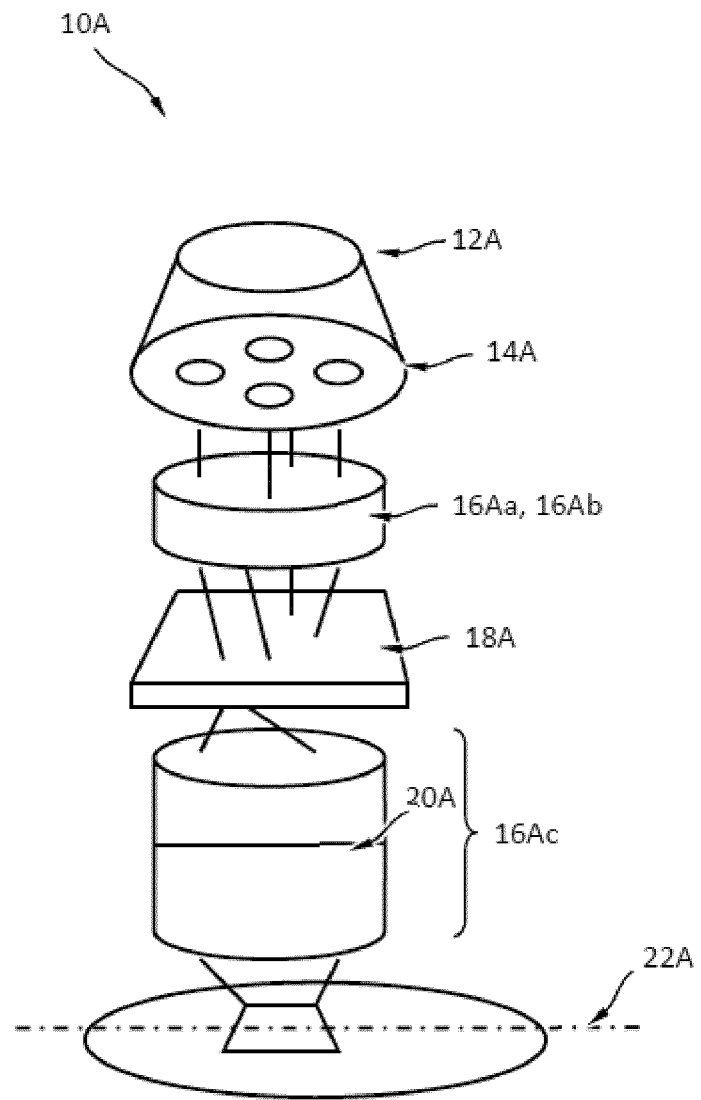
FIG. 1 illustrates a block diagram of various subsystems of a lithographic projection apparatus, according to an embodiment.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic methods.

An example of a programmable LCD array is given in U.S. Pat. No. 5,229,872, which is incorporated herein by reference.

FIG. 1 illustrates a block diagram of various subsystems of a lithographic projection apparatus 10A, according to an embodiment. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=n\ sin(\Theta_{max})$, wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, where each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to an embodiment of the present disclosure, one or more images may be generated. The images includes various types of signal that may be characterized by pixel values or intensity values of each pixel. Depending on the relative values of the pixel within the image, the signal may be referred as, for example, a weak signal or a strong signal, as may be understood by a person of ordinary skill in the art. The term "strong" and "weak" are relative terms based on intensity values of pixels within an image and specific values of intensity may not limit scope of the present disclosure. In an embodiment, the strong and weak signal may be identified based on a selected threshold value. In an embodiment, the threshold value may be fixed (e.g., a midpoint of a highest intensity and a lowest intensity of pixel within the image. In an embodiment, a strong signal may refer to a signal with values greater than or equal to an average signal value across the image and a weak signal may refer to signal with values less than the average signal value. In an embodiment, the relative intensity value may be based on percentage. For example, the weak signal may be signal having intensity less than 50% of the highest intensity of the pixel (e.g., pixels corresponding to target design may be considered pixels with highest intensity) within the image. Furthermore, each pixel within an image may considered as a variable. According to the present embodiment, derivatives or partial derivative may be determined with respect to each pixel within the image and the values of each pixel may be determined or modified according to a cost function based evaluation and/or gradient based computation of the cost function. For example, a CTM image may include pixels, where each pixel is a variable that can take any real value.

Figure 2:
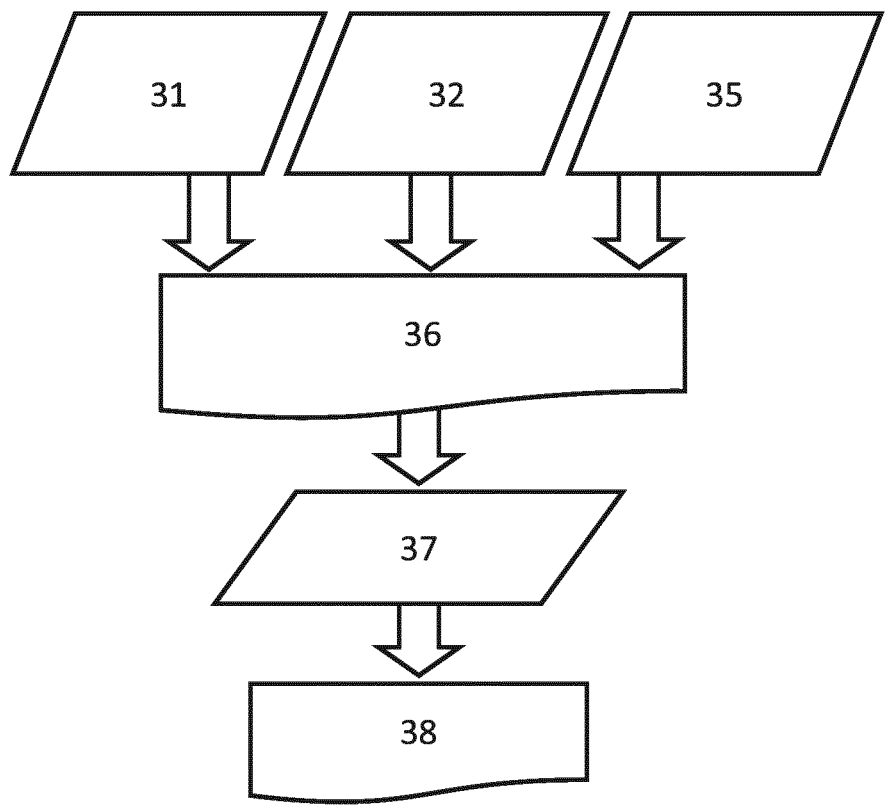
FIG. 2 illustrates an exemplary flow chart for simulating lithography in a lithographic projection apparatus, according to an embodiment.

FIG. 2 illustrates an exemplary flow chart for simulating lithography in a lithographic projection apparatus, according to an embodiment. Source model 31 represents optical characteristics (including radiation intensity distribution and/or phase distribution) of the source. Projection optics model 32 represents optical characteristics (including changes to the radiation intensity distribution and/or the phase distribution caused by the projection optics) of the projection optics. Design layout model 35 represents optical characteristics of a design layout (including changes to the radiation intensity distribution and/or the phase distribution caused by design layout 33), which is the representation of an arrangement of features on or formed by a patterning device. Aerial image 36 can be simulated from design layout model 35, projection optics model 32, and design layout model 35. Resist image 38 can be simulated from aerial image 36 using resist model 37. Simulation of lithography can, for example, predict contours and CDs in the resist image.

More specifically, it is noted that source model 31 can represent the optical characteristics of the source that include, but not limited to, numerical aperture settings, illumination sigma (σ) settings as well as any particular illumination shape (e.g. off-axis radiation sources such as annular, quadrupole, dipole, etc.). Projection optics model 32 can represent the optical characteristics of the projection optics, including aberration, distortion, one or more refractive indexes, one or more physical sizes, one or more physical dimensions, etc. Design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

where $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables $(z_1, z_2, \ldots, z_N)$. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In one embodiment, the design variables $(z_1, z_2, \ldots, z_N)$ comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$. The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

As used herein, the term "patterning process" means a process that creates an etched substrate by the application of specified patterns of light as part of a lithography process. The lithography process can also include photoresist exposure and development.

As used herein, the term "target design" means an idealized design that is to be etched on a substrate. The "target design," additionally or alternatively refers to the design on a mask or a reticle, which may include assist features.

As used herein, the term "printed design" means the physical design on a substrate that was etched based on a target design and can also refer to an after-development resist pattern on a photoresist. The printed design can include, for example, troughs, channels, depressions, edges, or other two and three dimensional features resulting from a lithography process.

As used herein, the term "process model" means a model that includes one or more models that simulate a lithography or other production process. For example, a process model can include any combination of: an optical model (e.g., that models a lens system/projection system used to deliver light in a lithography process and may include modelling the final optical image of light that goes onto a photoresist), a resist model (e.g., that models physical effects of the resist, such as chemical effects due to the light), an OPC model (e.g., that can be used to make target designs and may include sub-resolution resist features (SRAFs), etc.), an imaging device model (e.g., that models what an imaging device may image from a printed design).

As used herein, the term "imaging device" means any number or combination of devices and associated computer hardware and software that can be configured to generate images of a target, such as the printed design or portions thereof. Non-limiting examples of an imaging devices can include: scanning electron microscopes (SEMs), x-ray machines, etc.

Figure 3:
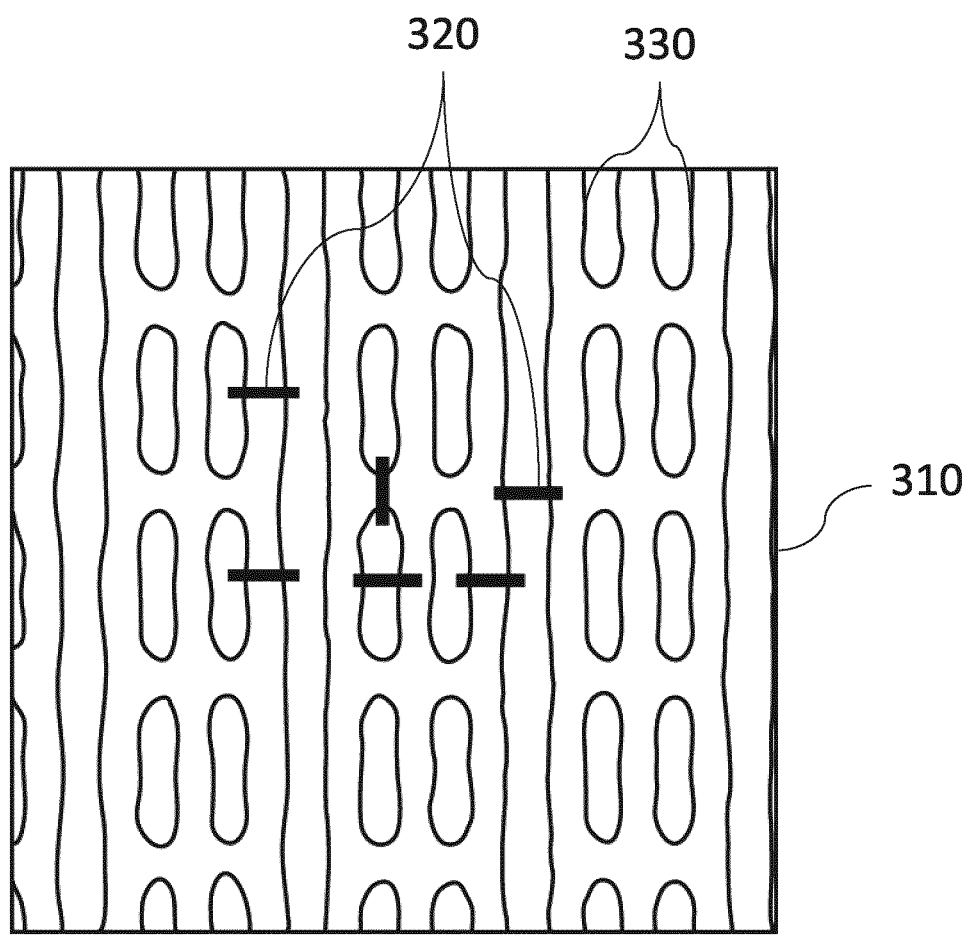
FIG. 3 is a simplified diagram illustrating an exemplary printed design, according to an embodiment.

FIG. 3 is a simplified diagram illustrating an exemplary printed design 310, according to an embodiment.

Figure 4:
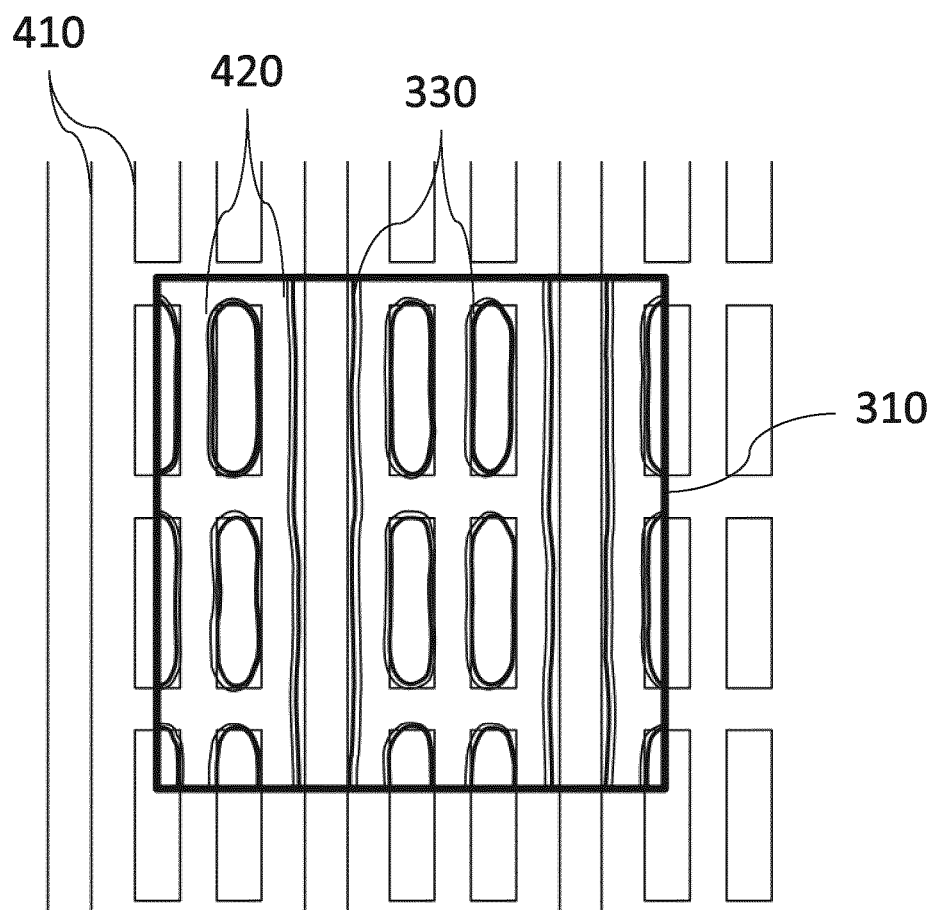
FIG. 4 is a simplified diagram illustrating an exemplary target design superimposed with the printed design, according to an embodiment.

In some manufacturing processes, simulations of the processes and implementation of the processes can be improved by comparing the resulting printed design 310 to the intended or target design (illustrated in FIG. 4). Such comparisons can be based on comparing critical dimensions (e.g., a width or other dimension associated with a feature) or particular coordinates (also referred to herein as edge placement (EP) gauges). Such features, in particular CDs, can be determined along cutlines 320 (some examples of such are illustrated in FIG. 3). In some cases, such features can be selected on an individual basis. However, the present disclosure provides systems, methods, and computer program products for implementing pattern recognition to allow the identification of many equivalent features. Some embodiments can then allow the averaging of such features (e.g., determining an average CD or EP gauge) and then comparing that to what it should be based on the printed design 310. Such an averaging process (involving hundreds or thousands of equivalent features), enabled by the pattern recognition algorithm, can provide a more accurate measurement of any differences between the printed design 310 and the target design. Accordingly, adjustments can be made to the patterning process to reduce such differences, for example as part of calibrating the process model.

As discussed in further detail herein, some embodiments include methods for improving a process model by measuring a feature on a printed design 310 that was constructed based in part on a target design. The method can include obtaining a) an image of the printed design 310 from an image capture device and b) contours 330 based on shapes in the image. Contours 330 can be generated by, for example, an edge detection program, contrast analysis, or other image analysis programs that find edges or boundaries of features from the image.

The method can then also include identifying, by a pattern recognition program, patterns on the target design that include the feature. Coordinates can be determined on the contours 330 that correspond to the feature. For example, as shown in FIG. 3, the intersection of the cutline 320 and the contour can be used to define a coordinate (e.g., x-y position) that can be used to define an EP gauge or used to calculate a CD.

The method can further include improving the process model by at least a) providing a measurement of the feature based on the coordinates and b) calibrating the process model based on a comparison of the measurement with a corresponding feature in the target design. For example, resist models, OPC models, etc. can be adjusted or calibrated, for example causing a reduction in the measured differences between the printed design and the target design. Details of the above methods and other embodiments are discussed herein.

As used herein, the term "feature" can be at least one of an edge placement gauge or a critical dimension. While described with reference herein to EP gauges and CDs, other features corresponding to the printed design can be used, for example, a curvature, a depth, an angle, band width, slope, from the printed design. Also, on images of the printed design, contrast, intensity, etc. can be treated similarly by the disclosure included herein.

Also as used herein, coordinates can be coordinates of edge placement gauges or critical dimensions (or other features). For example, an EP gauge can be a single coordinate. In contrast, a CD may be expressed as a single number (such as a length), but may also be expressed as a pair of coordinates that define the CD.

As described above, the measurement can be generated by averaging the coordinates. In other embodiments, the measurement can be generated by averaging CDs or other value(s) of the features.

In other embodiments, a measurement can include a statistical analysis rather than (or in addition to) a calculation of a dimension or coordinate as described above. For example, when a number of CDs have been identified by the pattern recognition program, a standard deviation, variance, etc. can be determined. In this example, a large standard deviation may be an indication of a need for adjustment of the process model. As mentioned above, such analysis and/or averaging of measurements can be based on, for example, the features of one or more of intensity, angle, slope, curvature, band width, contrast, etc.

FIG. 4 is a simplified diagram illustrating an exemplary target design 410 superimposed with the printed design, according to an embodiment.

In some embodiments, to compare the printed design to the target design 410, the printed design can be imaged by an image capture device (e.g., a SEM or an AFM). Image analysis software can then process these images to generate contours from the images that correspond to shapes 420 (e.g., holes, slots, etc.). Examples of contours generated from a printed design are shown in FIG. 4. Also, FIG. 4 shows a simplified representation of a target design 410 superimposed with contours. As shown in FIG. 4, where target design 410 has exact parallel lines and sharp corners, printed design contains some deviations and rounding.

As illustrated in FIG. 4, some embodiments include aligning the image with the target design 410 based at least on a comparison between the target design 410 and the contours. For example, image (or contours) can be expressed in terms of coordinates and translated, rotated, scaled, deformed, etc. to reduce the difference (e.g., distances) between these coordinates and the corresponding coordinates of the target design 410. In some embodiments, the alignment can be performed by reducing or minimizing an RMS of the measured distances between points in target design 410 and the contours.

Once the image and/or contours have been aligned with target design 410, comparison can be made between features of the target design 410 and printed design. However, as previously mentioned, embodiments that include utilization of a pattern recognition program can enable the determination of large numbers of equivalent features in a printed design, thus allowing a more accurate characterization of the process method.

Figure 5:
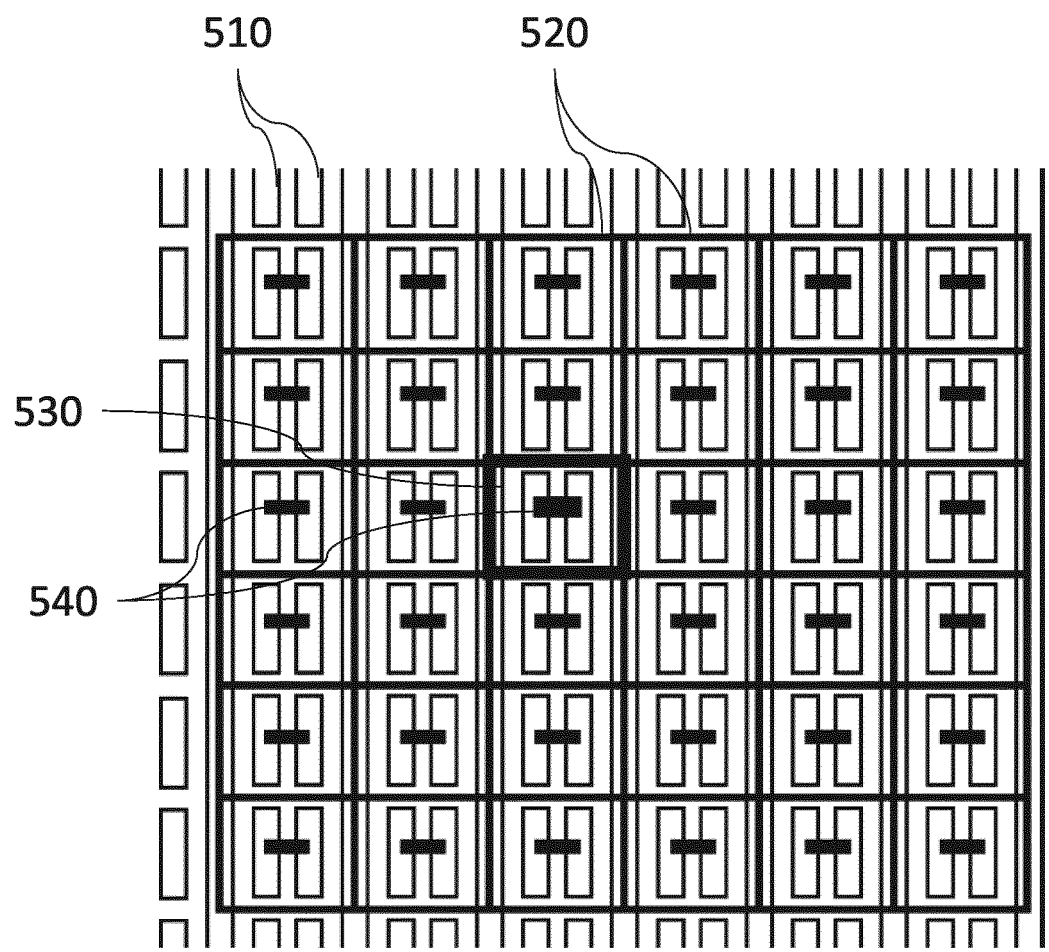
FIG. 5 is a simplified diagram illustrating identifying exemplary patterns in a target design, according to an embodiment.

FIG. 5 is a simplified diagram illustrating identifying exemplary patterns 520 in a target design 510, according to an embodiment.

In some embodiments, target design 510 can be analyzed by a pattern recognition program to determine instances of patterns 520 that may be present throughout target design 510. Such an embodiment can be referred to as "pattern search." In the simplified example of FIG. 5, target design 510 is shown (by the lightest weight lines) as having a number of short rectangular elements (e.g., slots) separated by long channels. In an embodiment, the pattern recognition program can receive first pattern 530, which can be supplied by a user or generated by another program. First pattern 530 is illustrated in FIG. 5 by the heaviest weight box near the middle of FIG. 5.

The pattern recognition program can then locate, from the target design 510, other patterns 520 that are the same as first pattern 530. The instances are illustrated in FIG. 5 by the medium weight lines. The determination of other patterns 520 can, in some embodiments, be based on comparing coordinates between first pattern 530 and coordinates in target design 510. In an embodiment, locating of the features the other patterns 520 can be based on a comparison of coordinates of polygons from the target design 510. For example, considering the two slots shown in first pattern

530, they may be defined by polygons (or any arrangement of shapes and points) that have specific coordinates. As a simple example, if a pattern consisted of only a square slot with vertices having coordinates (0,0), (0,1), (1,1), and (1,0), then if target design 510 somewhere contained the same coordinates, but shifted (e.g., (5,0), (5,1), (5,1), and (5,0)), then such would be identified as a matching pattern.

In some embodiments, the pattern recognition program can analyze the other coordinates in target design 510 to identify the other patterns 520 based on an exact match, which, in one embodiment, can have zero variation. In another embodiment, the exact match can include approximately zero variation, for example within any numerical error introduced by the computing system. In yet another embodiment, the exact match can have up to 0.1 nm of variation. Also, the pattern recognition program can identify the other patterns 520 based on a fuzzy match, which may allow up to 2 nm of variation between the coordinates in the other patterns 520. In other embodiments, the fuzzy match can allow for up to 1.5 nm of variation, up to 3 nm of variation, etc.

Once other patterns 520 are found, the coordinates used for the averaging process described above can be determined from the other patterns 520. As shown in FIG. 5, were cutline defined in first pattern 530 of target design 510, corresponding cutlines 540 can be defined in other patterns 520 (i.e., in other locations in target design 510). With printed design aligned to target design 510 as shown in FIG. 4, coordinates on the corresponding contours can be determined and averaged. In the simplified example of FIG. 5, instead of relying on a single cutline, 36 measurements could be taken and averaged. This can be extended to any number of cutlines 540 or patterns 520.

The pattern recognition program can have another function, referred to herein as "pattern grouping" where two patterns 520 are received and determined whether they are a "match" (based on exact or fuzzy, depending on the embodiment). Thus, in another embodiment, implementation of the pattern recognition program can include receiving, at the pattern recognition program, a first pattern 530 and a second pattern. Pattern recognition program can determine whether the first pattern 530 and the second pattern are the same based on the coordinates in the first and second pattern. Accordingly, the measurement can be determined at least based on the first pattern 530 and the second pattern. In any embodiments of the present disclosure, pattern recognition program can account for one or more of a translation or a rotation of the first pattern 530 (e.g., a collection of coordinates) relative to the second pattern when determining whether the first pattern 530 and the second pattern are the same.

Figure 6:
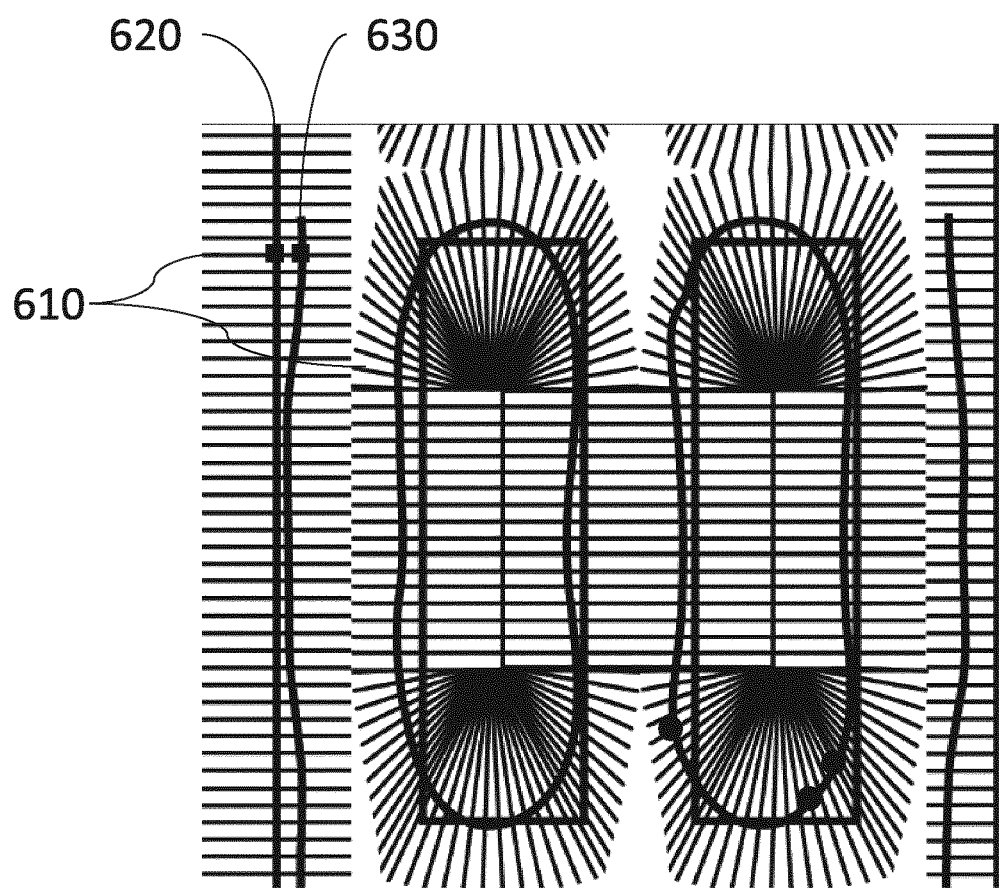
FIG. 6 is a simplified diagram illustrating an exemplary cutline placement, according to an embodiment.

FIG. 6 is a simplified diagram illustrating an exemplary cutline placement, according to an embodiment.

The embodiments described herein can allow the automatic placement of many cutlines 610 on the target design 620. For example, as illustrated in the example pattern shown in FIG. 6, there are two rectangular slots and edges of two channels. Cutlines 610 can be generated automatically by a cutline generation program or module, or designated by a user, or a combination of the two. Cutlines 610 can be placed to have a given separation and/or density along or on a shape or line. In an embodiment, user input can be received specifying a density of cutlines 610 along a portion of the other patterns, the density corresponding to a number of cutlines 610 per unit length along the portion.

In an embodiment, the system can provide automatic cutline placement are based on polygon edges. The system can loop through edges of the polygon (clockwise or anti-clockwise), and determine a width (intra-polygon distance) and space (inter-polygon distance), then place the cutline at constant intervals from half of the width to half of the space. This can also include generating cutlines that extend from the centers of the polygons. At the corner region, which can have turns including, for example, 90 degrees or −90 degrees, angled cutlines (also called rounding cutlines) can be generated. Such angled cutlines can be closer to the normal of a contour than a horizontal or vertical cutline.

As shown in FIG. 6, cutline generation can include generating horizontal or vertical cutline across one or more parallel lines in target design 620. In other embodiments, the parallel lines can be angled or have any other shape or curvature besides being strictly horizontal or vertical. For example, a circular channel or one with a bend can be made of two lines that are (locally) parallel to each other. Accordingly cutlines 610 can be used as the basis for determining critical dimension. Critical dimensions can be determined based at least an intersection of horizontal or vertical cutlines 610 with contours 630. Differences in CDs can be calculated based on differences in the coordinates of where cutlines intersect (shown by the two square points representing coordinates) target design 620 and contour 630. As apparent from FIG. 6, many such coordinates and critical dimensions can be determined throughout a given pattern.

Similarly, angled cutlines 610 can be generated extending from a point in the target design. The point at which horizontal or vertical cutlines 610 transition to angled cutlines 610 can be determined automatically by the system, or can be specified by a user. EP gauges can be generated based at least on an intersection of the angled cutline 610 with contours 630. As with CDs, EP gauges can be compared to the corresponding location in target design (e.g., by comparing the coordinates of the intersections with cutline 610).

Figure 7:
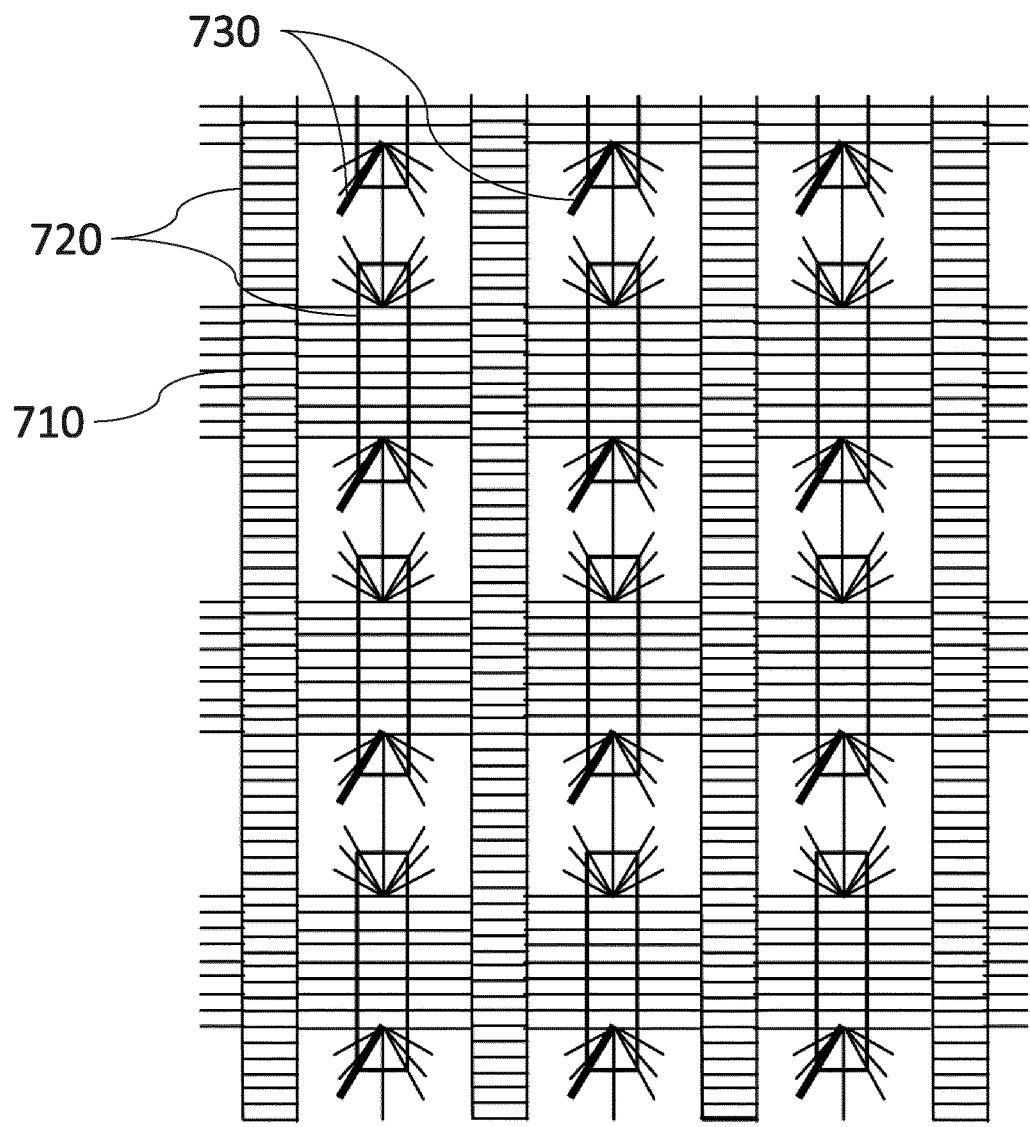
FIG. 7 is a simplified diagram illustrating identification of cutlines having a same context in a target design, according to an embodiment.

FIG. 7 is a simplified diagram illustrating identification of cutlines 710 having a same context in a target design 720, according to an embodiment.

The above embodiments can be extended and applied to the other patterns that are located in target design 720. One example of such is illustrated in FIG. 7, where a number of cutlines 710 have been placed throughout target design 720. Here, the pattern recognition program can identify other patterns (e.g., the rectangles) and accordingly generate cutlines 710 that correspond to the same feature (also referred to herein as having the same context). One example is shown by cutline 730 where these cutlines go through the corner of a shape in target design 720. As these cutlines 730 have the same context, a coordinate for the intersection of cutline 730 on target design 720 can be compared with the intersection of the corresponding contour. When contours of the printed design are aligned with target design 720, many CDs and EP gauges can be determined and used for averaging as described herein.

Figure 8:
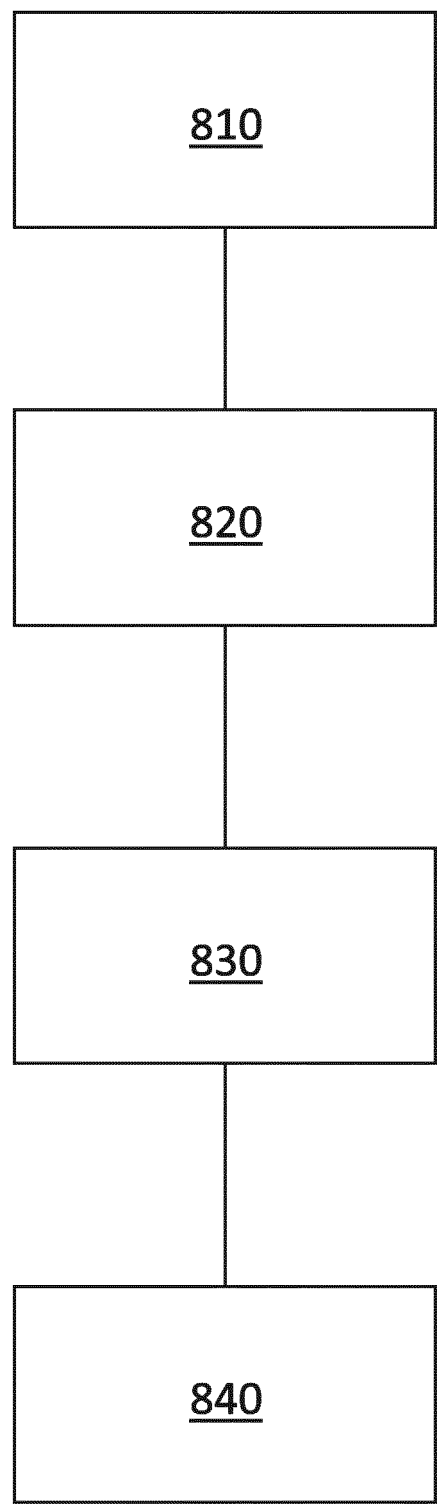
FIG. 8 is a process flow diagram illustrating implementing a pattern recognition program for measuring features of a printed design, according to an embodiment.

FIG. 8 is a process flow diagram illustrating implementing a pattern recognition program for measuring features of a printed design, according to an embodiment.

A method for improving a process model by measuring a feature on a printed design that was constructed based in part on a target design can include, at 810, obtaining a) an image of the printed design from an image capture device and b) contours based on shapes in the image.

At 820, a pattern recognition program can identify patterns on the target design that include the feature.

At 830, coordinates on the contours can be determined that correspond to the feature.

At 840, the process model can be improved by at least a) providing a measurement of the feature based on the coordinates and b) calibrating the process model based on a comparison of the measurement with a corresponding feature in the target design.

Figure 9:
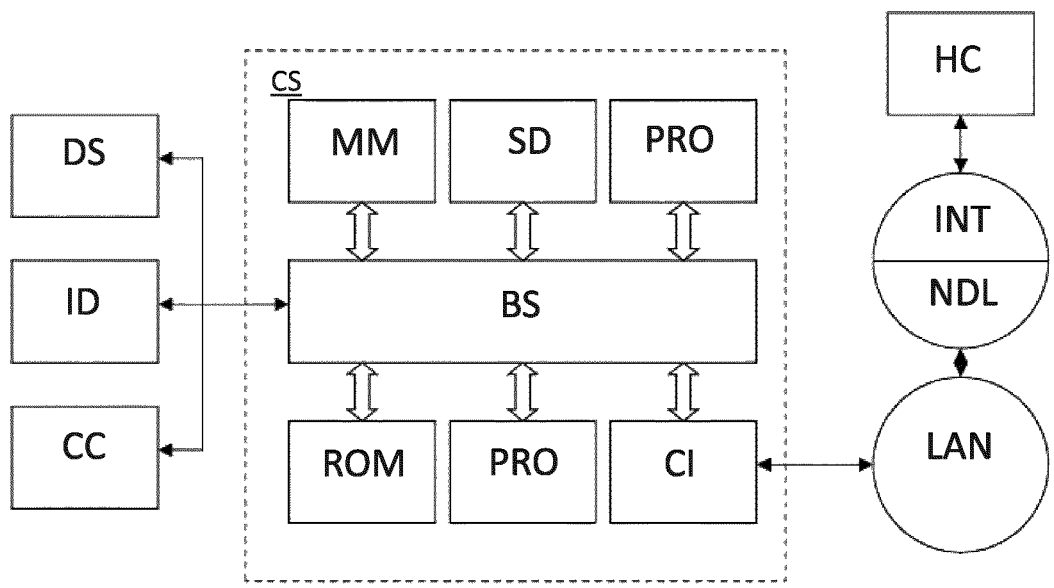
FIG. 9 is a block diagram of an example computer system, according to an embodiment.

FIG. 9 is a block diagram of an example computer system CS, according to an embodiment.

Computer system CS includes a bus BS or other communication mechanism for communicating information, and a processor PRO (or multiple processor) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 10:
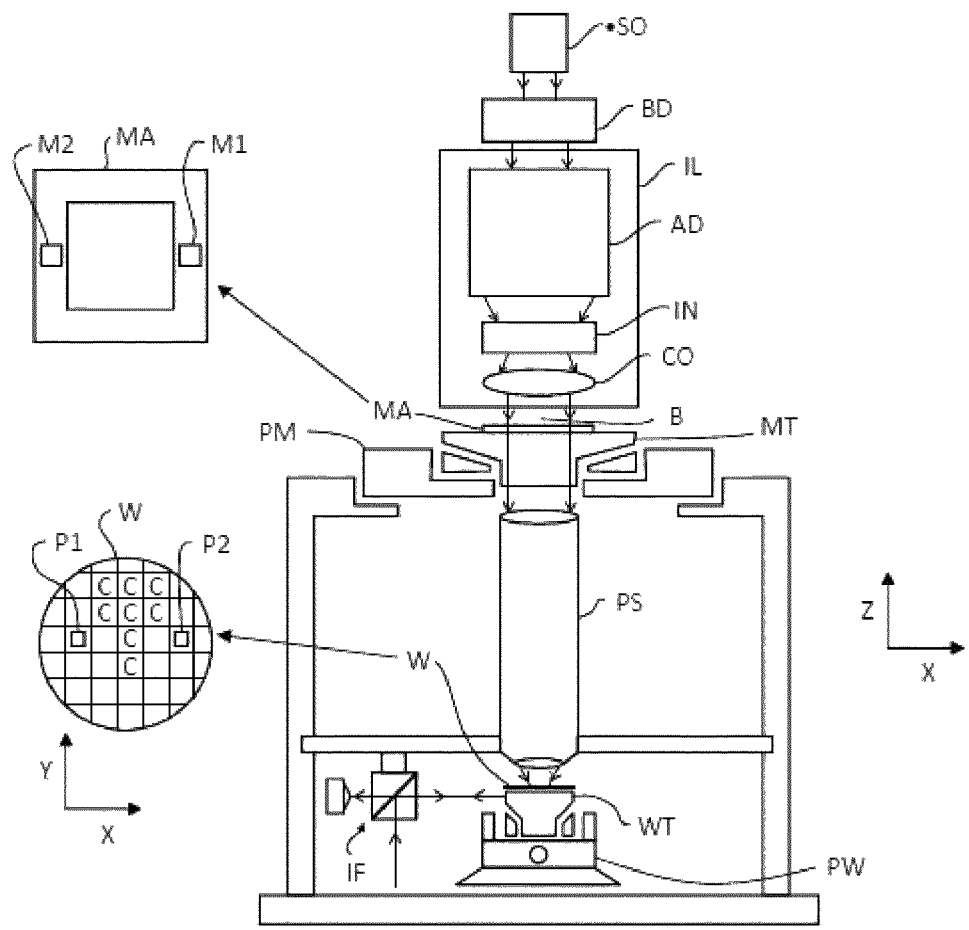
FIG. 10 is a schematic diagram of a lithographic projection apparatus, according to an embodiment.

FIG. 10 is a schematic diagram of a lithographic projection apparatus, according to an embodiment.

The lithographic projection apparatus can include an illumination system IL, a first object table MT, a second object table WT, and a projection system PS.

Illumination system IL, can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT. Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, e.g. so as to position different target portions C in the path of beam PB. Similarly, the first positioning apparatus can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 11:
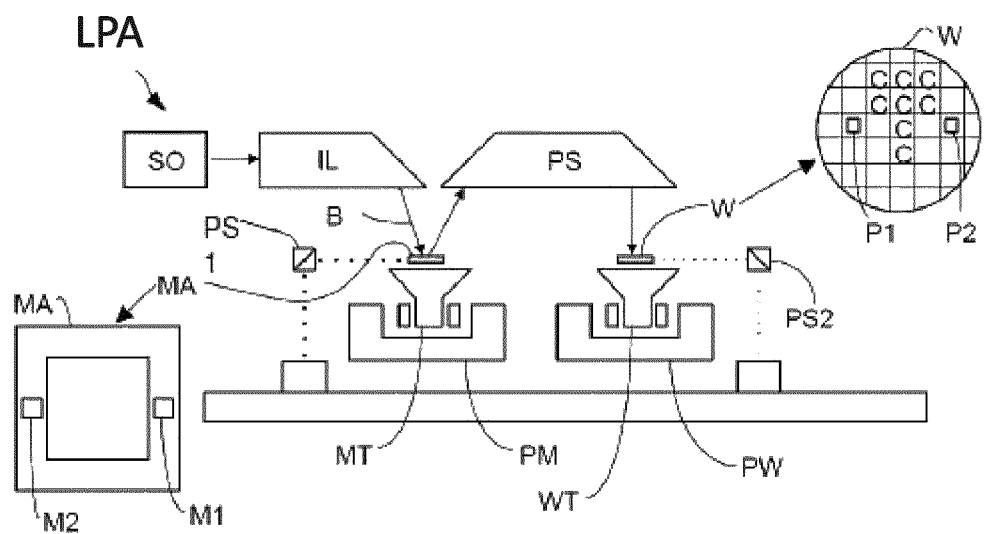
FIG. 11 is a schematic diagram of another lithographic projection apparatus, according to an embodiment.

FIG. 11 is a schematic diagram of another lithographic projection apparatus (LPA), according to an embodiment.

LPA can include source collector module SO, illumination system (illuminator) IL configured to condition a radiation beam B (e.g. EUV radiation), support structure MT, substrate table WT, and projection system PS.

Support structure (e.g. a patterning device table) MT can be constructed to support a patterning device (e.g. a mask or a reticle) MA and connected to a first positioner PM configured to accurately position the patterning device;

Substrate table (e.g. a wafer table) WT can be constructed to hold a substrate (e.g. a resist coated wafer) W and connected to a second positioner PW configured to accurately position the substrate.

Projection system (e.g. a reflective projection system) PS can be configured to project a pattern imparted to the radiation beam B by patterning device MA onto a target portion C (e.g. comprising one or more dies) of the substrate W.

As here depicted, LPA can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de-)magnification and image reversal characteristics of the projection system PS.

In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array.

Figure 12:
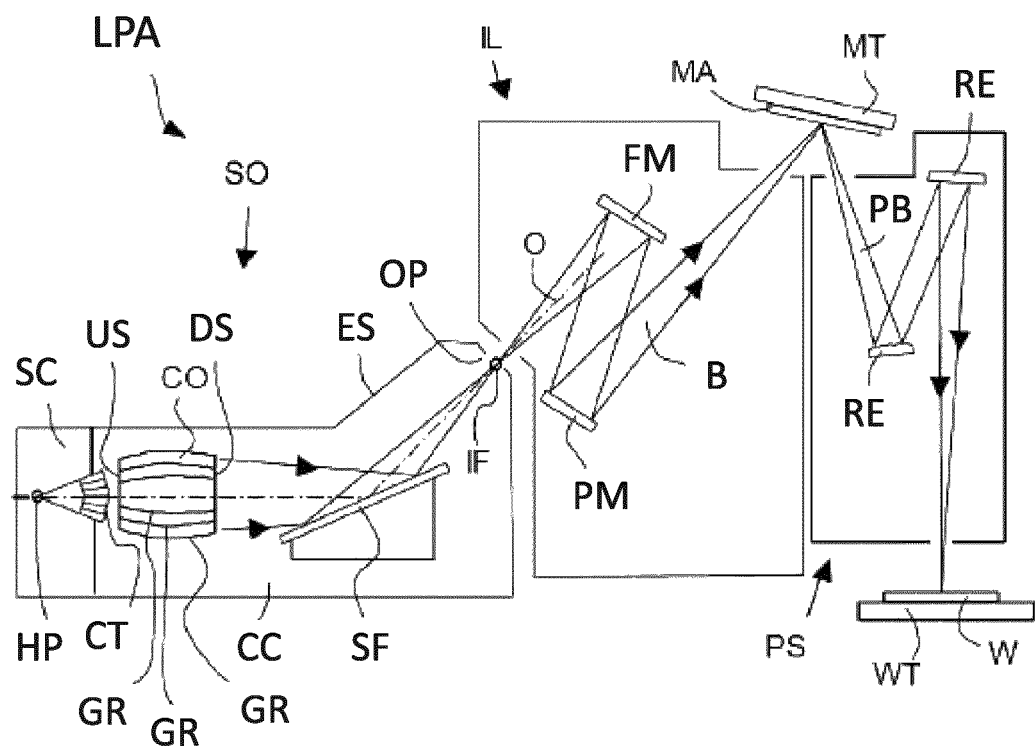
FIG. 12 is a detailed view of the lithographic projection apparatus, according to an embodiment.

FIG. 12 is a detailed view of the lithographic projection apparatus, according to an embodiment.

As shown, LPA can include the source collector module SO, the illumination system IL, and the projection system PS. The source collector module SO is constructed and arranged such that a vacuum environment can be maintained in an enclosing structure ES of the source collector module SO. An EUV radiation emitting hot plasma HP may be formed by a discharge produced plasma source. EUV radiation may be produced by a gas or vapor, for example Xe gas, Li vapor or Sn vapor in which the hot plasma HP is created to emit radiation in the EUV range of the electromagnetic spectrum. The hot plasma HP is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma HP is passed from a source chamber SC into a collector chamber CC via an optional gas barrier or contaminant trap CT (in some cases also referred to as contaminant barrier or foil trap) which is positioned in or behind an opening in source chamber SC. The contaminant trap CT may include a channel structure. Contamination trap CT may also include a gas barrier or a combination of a gas barrier and a channel structure. The contaminant trap or contaminant barrier CT further indicated herein at least includes a channel structure, as known in the art.

The collector chamber CC may include a radiation collector CO which may be a so-called grazing incidence collector. Radiation collector CO has an upstream radiation collector side US and a downstream radiation collector side DS. Radiation that traverses radiation collector CO can be reflected off a grating spectral filter SF to be focused in a virtual source point IF along the optical axis indicated by the dot-dashed line 'O'. The virtual source point IF can be referred to as the intermediate focus, and the source collector module can be arranged such that the intermediate focus IF is located at or near an opening OP in the enclosing structure ES. The virtual source point IF is an image of the radiation emitting plasma HP.

Subsequently the radiation traverses the illumination system IL, which may include a facetted field mirror device FM and a facetted pupil mirror device pm arranged to provide a desired angular distribution of the radiation beam B, at the patterning device MA, as well as a desired uniformity of radiation amplitude at the patterning device MA. Upon reflection of the beam of radiation B at the patterning device MA, held by the support structure MT, a patterned beam PB is formed and the patterned beam PB is imaged by the projection system PS via reflective elements RE onto a substrate W held by the substrate table WT.

More elements than shown may generally be present in illumination optics unit IL and projection system PS. The grating spectral filter SF may optionally be present, depending upon the type of lithographic apparatus. Further, there may be more mirrors present than those shown in the figures, for example there may be 1-6 additional reflective elements present in the projection system PS.

Collector optic CO can be a nested collector with grazing incidence reflectors GR, just as an example of a collector (or collector mirror). The grazing incidence reflectors GR are disposed axially symmetric around the optical axis O and a collector optic CO of this type may be used in combination with a discharge produced plasma source, often called a DPP source.

Figure 13:
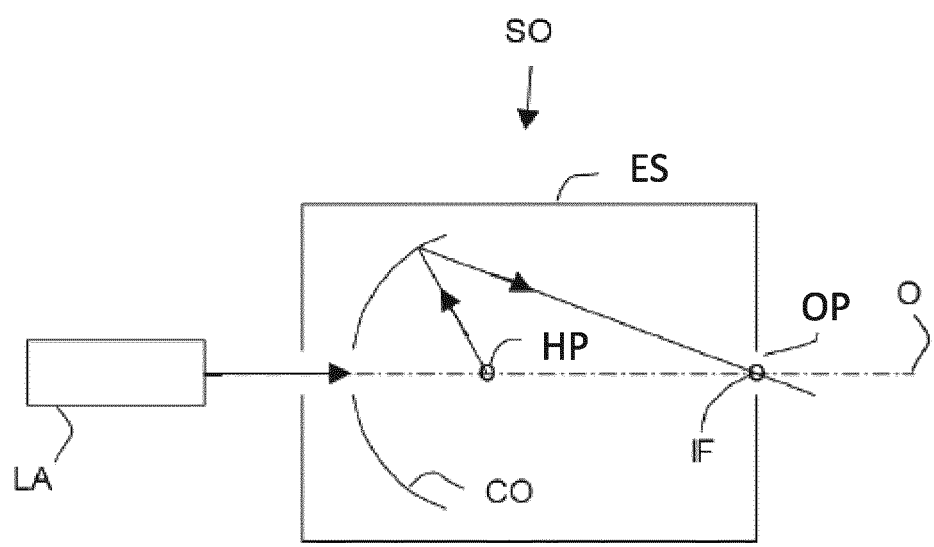
FIG. 13 is a detailed view of the source collector module of the lithographic projection apparatus, according to an embodiment.

FIG. 13 is a detailed view of source collector module SO of lithographic projection apparatus LPA, according to an embodiment.

Source collector module SO may be part of an LPA radiation system. A laser LA can be arranged to deposit laser energy into a fuel, such as xenon (Xe), tin (Sn) or lithium (Li), creating the highly ionized plasma HP with electron temperatures of several 10's of eV. The energetic radiation generated during de-excitation and recombination of these ions is emitted from the plasma, collected by a near normal incidence collector optic CO and focused onto the opening OP in the enclosing structure ES.

The embodiments may further be described using the following clauses:

1. A method for improving a process model by measuring a feature on a printed design that was constructed based in part on a target design, the method comprising:
   obtaining a) an image of the printed design from an image capture device and b) contours based on shapes in the image;
   identifying, by a pattern recognition program, patterns on the target design that include the feature; determining coordinates, on the contours, that correspond to the feature; and improving the process model by at least a) providing a measurement of the feature based on the coordinates and b) calibrating the process model based on a comparison of the measurement with a corresponding feature in the target design.
2. The method of clause 1, wherein the feature is at least one of an edge placement gauge or a critical dimension.
3. The method of clause 1, wherein the coordinates are coordinates of edge placement gauges or critical dimensions.
4. The method of clause 1, wherein the measurement is generated by averaging the coordinates.
5. The method of clause 1, wherein the feature comprises at least one of a curvature, a depth, an angle, a band width, and a slope on the printed design.
6. The method of clause 1, wherein the feature comprises at least one of a contrast and an intensity of the image.
7. The method of clause 1, further comprising generating the contours from the image.
8. The method of clause 7, further comprising aligning the image with the target design based at least on a comparison between the target design and the contours.
9. The method of clause 7, further comprising generating horizontal or vertical cutline across one or more parallel lines in the target design.
10. The method of clause 9, further comprising determining a critical dimension based at least an intersection of the horizontal or vertical cutline with the contours.
11. The method of clause 7, further comprising generating an angled cutline extending from a point in the target design.
12. The method of clause 11, further comprising generating an EP gauge based at least on an intersection of the angled cutline with the contours.
13. The method of clause 1, further comprising receiving user input specifying a density of cutlines along a portion of the patterns, the density corresponding to a number of cutlines per unit length along the portion.
14. The method of clause 1, further comprising: locating, from the target design, other patterns that are the same as the pattern; and determining the coordinates from the other patterns.
15. The method of clause 14, wherein the locating is further based on a comparison of coordinates of polygons from the target design.
16. The method of clause 1, further comprising:
   receiving, at the pattern recognition program, a first pattern and a second pattern;
   determining whether the first pattern and the second pattern are the same based on a plurality of the coordinates in the first and second pattern; and
   determining the measurement at least based on the first pattern and the second pattern.
17. The method of clause 16, further comprising accounting for one or more of a translation or a rotation of the first pattern relative to the second pattern when determining whether the first pattern and the second pattern are the same.
18. The method of clause 1, wherein the pattern recognition program identifies other patterns based on an exact match having zero variation.
19. The method of clause 1, wherein the pattern recognition program identifies other patterns based on a fuzzy match.
20. The method of clause 19, wherein the fuzzy match allows up to 2 nm of variation between the coordinates in the other patterns.
21. A method for calibrating an optical proximity correction model by measuring a feature on a printed design that was constructed based in part on a target design, the method comprising:
   obtaining a) an image of the printed design from a scanning electron microscope and b) contours based on shapes in the image;
   identifying, by a pattern recognition program, patterns on the target design that include the feature;
   determining coordinates, on the contours, that correspond to the feature; and
   improving the optical proximity correction model by at least a) providing a measurement of the feature based on the coordinates and b) calibrating the process model based on a comparison of the measurement with a corresponding feature in the target design.
22. A computer program product comprising a non-transitory computer readable medium having instructions recorded thereon, the instructions when executed by a computer implementing the method of any of the above clauses.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A computer program product comprising a non-transitory computer-readable medium having instructions therein, the instructions, when executed by a computer system, configured to cause the computer system to at least:
   obtain a) an image of a printed design that was constructed based in part on a target design, from an image capture device and b) contours based on shapes in the image;
   identify, by a pattern recognition program, patterns on the target design that include a feature;
   determine coordinates, on the contours, that correspond to the feature; and
   improve a process model by at least a) providing a measurement of the feature based on the coordinates and b) calibrating the process model based on a comparison of the measurement with a corresponding feature in the target design.

2. The medium of claim 1, wherein the feature is an edge placement gauge and/or a critical dimension.

3. The medium of claim 1, wherein the coordinates are coordinates of edge placement gauges or critical dimensions.

4. The medium of claim 1, wherein the measurement is generated by averaging the coordinates.

5. The medium of claim 1, wherein the feature comprises a curvature, a depth, an angle, a band width, and/or a slope on the printed design.

6. The medium of claim 1, wherein the feature comprises a contrast and/or an intensity of the image.

7. The medium of claim 1, wherein the instructions are further configured to cause the computer system to generate the contours from the image.

8. The medium of claim 7, wherein the instructions are further configured to cause the computer system to align the image with the target design based at least on a comparison between the target design and the contours.

9. The medium of claim 7, wherein the instructions are further configured to cause the computer system to generate a horizontal or vertical cutline across one or more parallel lines in the target design.

10. The medium of claim 9, wherein the instructions are further configured to cause the computer system to determine a critical dimension based at least an intersection of the horizontal or vertical cutline with the contours.

11. The medium of claim 7, wherein the instructions are further configured to cause the computer system to generate an angled cutline extending from a point in the target design.

12. The medium of claim 11, wherein the instructions are further configured to cause the computer system to generate an edge placement gauge based at least on an intersection of the angled cutline with the contours.

13. The medium of claim 1, wherein the instructions are further configured to cause the computer system to receive user input specifying a density of cutlines along a portion of the patterns, the density corresponding to a number of cutlines per unit length along the portion.

14. The medium of claim 1, wherein the instructions are further configured to cause the computer system to:
   locate, from the target design, other patterns that are the same as a particular pattern; and
   determine the coordinates from the other patterns.

15. The medium of claim 14, wherein the instructions configured to cause the computer system to locate other patterns are configured to do so based on a comparison of coordinates of polygons from the target design.

16. The medium of claim 1, wherein the instructions are further configured to cause the computer system to:
   receive, at the pattern recognition program, a first pattern and a second pattern;
   determine whether the first pattern and the second pattern are the same based on a plurality of the coordinates in the first and second patterns; and
   determine the measurement at least based on the first pattern and the second pattern.

17. The medium of claim 16, wherein the instructions are further configured to cause the computer system to account for one or more of a translation or a rotation of the first pattern relative to the second pattern when determining whether the first pattern and the second pattern are the same.

18. The medium of claim 1, wherein the pattern recognition program identifies other patterns based on an exact match having zero variation.

19. The medium of claim 1, wherein the pattern recognition program identifies other patterns based on a fuzzy match.

20. A computer program product comprising a non-transitory computer-readable medium having instructions therein, the instructions, when executed by a computer system, configured to cause the computer system to at least:
   obtain a) an image of a printed design that was constructed based in part on a target design, from a scanning electron microscope and b) contours based on shapes in the image;
   identify, by a pattern recognition program, patterns on the target design that include a feature;
   determine coordinates, on the contours, that correspond to the feature; and
   improve an optical proximity correction model by at least a) providing a measurement of the feature based on the coordinates and b) calibrating the process model based on a comparison of the measurement with a corresponding feature in the target design.

* * * * *